METHOD OF MAKING SEMICONDUCTORS AND DIFFUSION THEREOF

Filed May 14, 1963

United States Patent Office 3,298,082
Patented Jan. 17, 1967

3,298,082
METHOD OF MAKING SEMICONDUCTORS AND DIFFUSION THEREOF

Masami Tomono, Kokubunji-machi, Kitatama-gun, Tokyo-to, Hiroshi Ueda, Suginami-ku, Tokyo-to, Takeshi Takagi, Musashino-shi, and Kazunari Kobayashi, Ota-ku, Tokyo-to, Japan, assignors to Kabushiki Kaisha Hitachi Seisakusho, Tokyo-to, Japan, a joint-stock company of Japan Filed May 14, 1963, Ser. No. 280,274
10 Claims. (Cl. 29—25.3)

Figure 1:
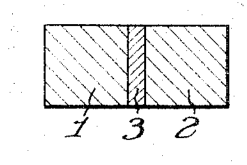

This invention relates to semiconductors, and more particularly it relates to new semiconductor devices having highly advantageous features and to techniques in the fabrication of these semiconductor devices.

In a more specific aspect of the invention, it relates to transistors of the type having a construction such as that, for example, of a grown junction type or like type, wherein on the two sides of a thin base layer of an n-type or p-type semiconductor an emitter region and a collector region of a conductivity type opposite to that of the said base layer are respectively formed.

In general, the base layer of a transistor having such a construction of the above-stated grown junction type or like type transistor is very thin, the thickness being 20 microns or less. For this reason the fabrication of the base contact of this base layer entails various technical difficulties.

Furthermore, such a construction has additional disadvantages such as partial damage to the pn junctions existing between the emitter region and the base region and between the base region and the collector region during the fabrication of the base contact, increase in the base spreading resistance $r_{bb'}$ due to the extremely small contacting part between the base layer and the base lead, and great impairment of the high-frequency characteristics of the transistor due to the overlapping of the emitter region by the abovesaid contacting parts and the formation thereat of a pn junction of large capacitance.

It is an object of the present invention to provide new semiconductor devices which are not accompanied by the above-described disadvantages.

Moreover, it is an object of the invention to provide pnp or npn junction transistors having electrically and mechanically excellent base contacts which can be readily fabricated.

It is a further object of the invention to provide semiconductor devices containing a plurality of the abovesaid transistors.

More specifically, the invention contemplates providing a construction wherein, by introducing into the outer surface parts of the aforesaid base layer and into the outer surface parts of the aforesaid collector region adjacent to the base layer an impurity which will impart thereto the same conductivity type as the said base layer, the said base layer, in actual effect, is caused to expand over the said outer surface parts, and base contact is formed onto the extended part of the base so created.

Figure 2:
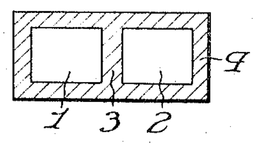
Figure 3A:
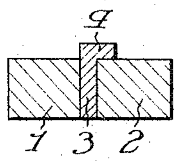
Figure 3B:
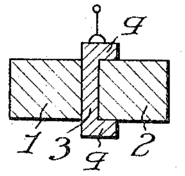
Figure 4A:
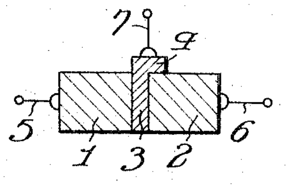
Figure 4B:
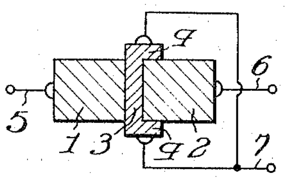
Figure 5:
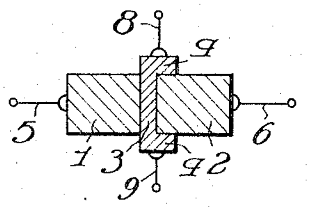

The precise nature, principle, and details of the present invention will be more clearly apparent by reference to the following detailed description of a few embodiments of the fabrication according to the invention, when taken in conjunction with the accompanying drawings which are sectional views, in which like parts are designated by like reference numerals, and in which:

FIG. 1 shows a grown junction transistor unit of known type;

FIGS. 2 and 3, respectively, show steps of fabrication of a semiconductor device according to the invention;

FIGS. 4 and 5, respectively, show embodiments of the semiconductor device according to the invention; and FIGS. 6 through 10, inclusive, show other examples of steps of fabrication according to the invention.

*Example 1*

Referring to FIG. 1, which is a sectional view showing the construction of a transistor of a known grown junction type or like type, such as is aforementioned in the introductory description, the transistor consists of an emitter region 1 having a p-type conductivity obtained by doping germanium with a p-type impurity material, a collector region 2 also having a p-type conductivity, and a base layer 3 having an n-type conductivity and interposed between the said regions 1 and 2 of p-type conductivity.

According to one embodiment of the present invention, the above pnp junction transistor of known type is heated, for example, at 800 degrees C. in the presence of arsenic vapor for approximately one hour. By this heating process, the aforesaid n-type impurity material is caused to be diffused on the entire surface of the transistor as indicated in FIG. 2, whereby an n-type diffused layer 4 is formed.

Next, the outer surface of the n-type layer 4 in the vicinity of the n-type base layer 3 is masked by coating with wax or by some other method, without extending the masked region over the p-type emitter region. Then, the diffused layer of the transistor other than the region so masked is etched chemically or by some other method. As a result, a transistor wherein the base layer 3 has been caused to extend on the outer surface of the collector region 2 as shown in FIG. 3 is obtained. FIG. 3(*a*) illustrates one example of the construction resulting from applying a masking layer over one part of the surface of an n-type diffused layer formed by the above-described method on the base layer and the collector region in the vicinity of the base layer of a pnp junction transistor unit and then carrying out etching of the other regions. FIG. 3(*b*) illustrates the case wherein etching has been effected after applying said masking layer over the entire surface.

Then, by connecting electrodes 5 and 6, respectively, to the emitter 1 and collector 2 of the above-described transistor unit and further connecting one or more base leads 7 at appropriate positions to the n-type diffused layer 4 as shown in FIG. 4, the desired transistor is formed. If, in this construction, the resistance value of the diffused layer 4 is caused to be sufficiently small, the base spreading resistance $r_{bb'}$ can be made sufficiently small irrespective of the distance between each base lead 7 and the originally existing base layer 3. Furthermore, since the base electrode is secured onto the diffused layer 4 which has been diffused over the surface of the collector region 2, such assembly operation in the case of the transistors according to the present invention is substantially easier than in the case of conventional transistors of this type. The base spreading resistance $r_{bb'}$ can be further reduced by connecting a plurality of leads, each at one end thereof, to a plurality of points on the diffused layer 4 and commonly connecting the other ends of the said leads as shown in FIG. 4(*b*).

The transistor shown in FIG. 5 is a so-called tetrode transistor, which can be used as a double-base transistor by cutting away a part of the n-type diffused layer, connecting leads 8 and 9 as shown, and using these leads independently.

*Example 2*

Figure 6:
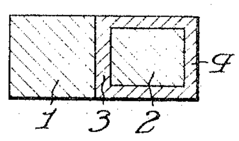
Figure 7:
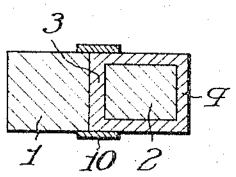
Figure 8:
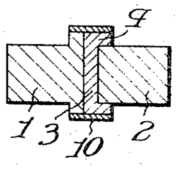

Another embodiment of the fabrication method of this invention for producing a transistor unit such as is shown in FIG. 3 is based on the following principle. It is known that, in general, in a transistor of the grown junction type as shown in FIG. 1 or like type, it is preferable that the active impurity concentration within the collector region 2 be lower than that in the emitter region 1. For this reason, by adjusting the concentration, on the outer surface of the semiconductor unit, of the active impurity of the same conductivity type as the base layer 3 which is diffused from the entire surface of the above-described transistor unit, it is possible to change only the conductivity type of the surface of the collector region 2, without changing the conductivity type of the emitter region surface, and to form a diffused layer 4 only on the collector region surface as indicated in FIG. 6. As a result, by applying a coating of an etch-proof wax 10, as indicated in FIG. 7, on only the surface of the base layer 3 and the diffused layer 4 on the surface of the collector region 2 in the vicinity of the said base layer 3, then carrying out etching treatment by a chemical or some other method, it is possible to produce a transistor unit as shown in FIG. 8 which has a construction similar to that of the unit shown in FIG. 3.

In order to indicate still more fully the nature of the present invention, a second embodiment thereof is described in greater detail hereinbelow. In general, in a pnp-type grown junction transistor in which a semiconductor such as, for example, germanium, is used, the acceptor concentrations in the emitter and collectors regions, denoted respectively by $N_{AE}$ (atoms/cm.$^3$) and $N_{AC}$ (atoms/cm.$^3$), have the following mutual relationship.

$$N_{AE}>N_{AC} \quad (1)$$

For example, in a germanium pnp grown junction transistor bar of a certain type, the active impurity concentrations in the respective semiconductor regions are as follows:

$$N_{AE}=5\times10^{16} \text{ atoms/cm.}^3 (\rho_E=0.05 \text{ ohm cm.})$$

and $$N_{AC}=4\times10^{15} \text{ atoms/cm.}^3 (\rho_C=0.5 \text{ ohm cm.})$$

Furthermore, the donor concentration $N_{BD}$ of the base layer is as follows:

$$N_{BD}=2\times10^{16} \text{ atoms/cm.}^3 (\rho_B=0.1 \text{ ohm cm.})$$

Accordingly, by heating the transistor bar, for example, in arsenic vapor at a temperature of 800 degrees C. for approximately one hour, so that the condition expressed by the following Equation 2 is satisfied, it is possible to form an $n^+$ diffused layer 4 on the surface layer parts of the base layer 3 and collector region 2 as indicated in FIG. 6 without converting the conductivity type of the emitter region 1.

$$N_{AE}\geqq N_{DS}>N_{AC} \quad (2)$$

were $N_{DS}$ (atoms/cm.$^3$) denotes the donor concentration on the surface of the said transistor bar.

Next, a layer 10 of an etch-proof material such as wax is formed over the surface in the vicinity of the base layer, including the base layer 3 (as indicated in FIG. 7). Then the surface layer of the semiconductor other than the parts directly under the wax layer 10, particularly the aforementioned diffused layer 4, is removed in an etchant, for example, one composed principally of hydrofluoric acid (HF) and nitric acid ($HNO_3$), at least until the collector region 2 is reached (as indicated in FIG. 8). The etch-proof wax layer 10 on the semiconductor unit which has been subjected to the foregoing process is then removed by dissolving in a solvent such as, for example, trichloroethylene, after which a lead 7 is soldered onto the surface of the base layer 3. In the foregoing manner, the required junction type transistor unit is obtained.

Figure 9A:
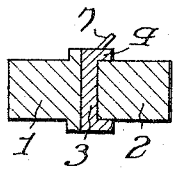
Figure 9B:
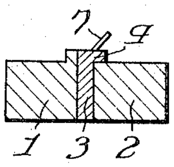

Completed transistor units so produced are shown in FIG. 9. The unit shown in FIG. 9 (*a*) is fabricated by masking the unit in the vicinity of the base layer by an etch-proof wax, and the unit shown in FIG. 9(*b*) is fabricated by masking one part of the unit with the wax, the semiconductor surface layer other than the parts directly under the masking layer being then removed in each case.

It will be obvious that the afore-mentioned surface donor concentration $N_{DS}$ can be increased to the extent whereby the surface layer of the emitter becomes one of intrinsic conduction type.

Figure 10:
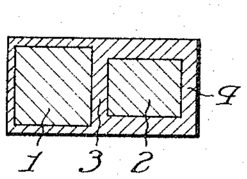

Furthermore, while the foregoing description relates particularly to the case wherein diffusion treatment has been accomplished under the condition of $N_{DS}\leqq N_{AE}$, it is possible from the relationship indicated by Equation 1, to obtain a unit having a collector region 2 with a conversion layer which is thicker than that of the emitter region 1, as indicated in FIG. 10, also when the condition is caused to be $N_{DS}>N_{AE}$. Therefore, by etching the entire surface of the unit only slightly in an etchant, it is possible, in actual effect, to obtain a transistor of the same construction as that indicated in FIG. 9.

In this case, since there is no diffused layer on the surface of the emitter region 1, a diffused layer 4 can be locally diffused in a simple manner only on the surface part of the collector region 2. That is, the diffused layer 4 to be discarded may also be etched with the etch-proof wax 10 spread over the surface of the emitter region 1. Accordingly, fabrication is readily possible also in the case when the thickness of the base layer 3 is very thin.

*Example 3*

The invention will be further described with respect to another embodiment of the method according to the invention of producing a semiconductor unit such as that shown in FIG. 3. When silicon is used as the base semiconductor, a silicon dioxide ($SiO_2$) layer formed on the surface of said silicon base has a propery of suppressing the diffusion of some active impurities into the semiconductor. The layer having said property is generally known as the diffusion suppressing layer. For this reason, the desired pnp-type semiconductor unit can be produced by covering the entire surface of the emitter of a pnp transistor bar of a grown junction type or similar type with an $SiO_2$ film, then causing diffusion of an n-type active impurity, applying etch-proof wax on only the diffused layer of the base layer surface and of the surface of the collector region in the vicinity of the said base layer, and then carrying out etching treatment by a chemical or some other method.

The method of the present invention can be further improved by utilizing the fact that the diffusion suppressing layer such as the aforementioned silicon dioxide layer can control or suppress the diffusion of the impurities into a semiconductor. This improved method can be embodied by the feature, wherein, when the base semiconductor consists of silicon, the surface of said semiconductor is oxidized or when said base semiconductor consists of a material except silicon of germanium an $SiO_2$ layer is made to adhere onto the surface of said semiconductor by evaporation or growth method, whereby an $SiO_2$ layer having a thickness of the order capable of sufficiently suppressing the diffusion of the impurity is formed on the surface of the said base semiconductor; one part of the $SiO_2$ layer on the surface of the said base layer and on the collector and emitter surfaces adjacent the said base layer is subjected to an etching; and then the bar of the said transistor is subjected to a diffusion treatment in an atmosphere containing an impurity of a quantity which is sufficient not to reverse the conductivity type of the emitter and to reverse the conductivity type of the collector. The thus obtained transistor bar can be obtained without etching after its diffusion treatment, and the collector junction reverse withstand voltage which is important is covered by an $SiO_2$ layer, thus causing advantages such that the collector becomes very excellent in its properties and very high in its reliability.

While the above-embodiments have been described principally with respect to a pnp semiconductor unit, the same considerations are applicable also in the case of an npn semiconductor unit. Furthermore, the present invention is not limited in application to germanium and silicon transistors but is equally applicable to transistors wherein other semiconductors are used. Moreover, the above-described embodiments, in all cases, are applicable also to tetrode transistors and to integrated semiconductor devices composed of a plurality of transistors.

Although the present invention has been described with respect to particular embodiments thereof, it is not to be so limited as changes and modifications may be made therein which are within the full intended scope of the invention, as defined by the appended claims.

What is claimed is:

1. A method of fabricating semiconductor devices comprising steps of preparing a semiconductor body which contains two regions having one conductivity type and being arranged at mutually separated positions, and a thin layer of a different conductivity type from that of said two regions which is sandwiched between said two regions and forms a pn junction with said two regions; diffusing an impurity of said different conductivity type into the surface part where at least said thin layer and one of said two regions of said semiconductor body are exposed, thereby forming a diffused layer of said different conductivity type extending from said thin layer onto the surface part of at least one of said two regions; masking a portion imediately adjacent to said portion of the diffused layer which extends on at least a part of said thin layer and on one of said two regions; entirely etch-removing the exposed part of said diffused layer to form a diffused portion of said different conductivity type locally existing only on the surface part immediately adajcent to said thin layer between said two regions extending from said thin layer; and connecting at least one lead wire to said diffused layer.

2. The method of farbicating semiconductor devices as defined in claim 1, wherein said diffused layer is formed substantially perpendicularly with respect to said thin layer.

3. The method of fabricating semiconductor devices as defined in claim 1, wherein said diffused layer is formed to enclose the entire external surface of said thin layer.

4. The method of fabricating semiconductor devices as defined in claim 1, wherein said two regions are constituted by a p-type semiconductor material and said thin layer is constituted by an n-type semiconductor material.

5. The method of fabricating semiconductor devices as defined in claim 1, wherein two lead wires are connected to said diffused layer at mutually separated positions.

6. The method of fabricating semiconductor devices as defined in claim 1, wherein one of said two regions possesses higher conductivity than the other.

7. The method of fabricating semiconductor devices as defined in claim 1, wherein an impurity having said different conductivity type is diffused into the surface part where at least said thin layer and one of said two regions are exposed, whereby, when a diffused layer of said different conductivity type extending from the surface of said thin layer to the surface part of at least one of said two regions is formed, the depth of the diffusion in said respective regions is made to be different .

8. A method of fabricating semiconductor devices comprising the steps of preparing a semiconductor body having a p-type emitter region, a p-type collector region and a central n-type base layer sandwiched therebetween; diffusing an n-type impurity into the surfaces so as to have a greater diffusion portion on the collector side than on the emitter side; masking the central n-portion; etching the diffused layer to completely remove the diffused portion from the diffused p-surface and leave upstanding the n-base portion; then connecting leads to the central n-base portion.

9. A method of fabricating transistors comprising: preparing a semiconductor body having an emitter and a collector region of the first conductivity type and a base region of the second conductivity type; diffusing an impurity having the second conductivity type to the surface of said semiconductor body to form a greater area of a diffused layer having said second conductivity type on said collector region than that on said emitter region; masking the surface of said base region and the adjacent portion thereof with an etch-proof material, thereafter entirely etch-removing the exposed diffused layer from said semiconductor body, leaving said masked diffused region in the vicinity of said base region; and connecting at least one lead wire to said diffused region.

10. The method of fabricating transistors as defined in claim 8, wherein said first conductivity type is p-type and said second conductivity type is n-type.

References Cited by the Examiner

UNITED STATES PATENTS

| | | | |
|---|---|---|---|
| 2,623,102 | 12/1952 | Shockley | 148—1.5 X |
| 2,795,742 | 6/1957 | Pfann. | |
| 2,813,233 | 11/1957 | Shockley. | |
| 2,845,372 | 7/1958 | Jones | 148—33.5 X |
| 3,146,135 | 8/1964 | Chih-Tang-Sah | 148—33.5 X |
| 3,156,591 | 11/1964 | Hale | 148—1.5 X |
| 3,194,699 | 7/1965 | White | 148—187 X |

HYLAND BIZOT, *Primary Examiner.*